United States Patent
Kim et al.

[11] Patent Number: 6,053,234
[45] Date of Patent: Apr. 25, 2000

[54] LEAD FRAME TRANSFER DEVICE AND WIRE BONDING APPARATUS COMPRISING THE SAME

[75] Inventors: Deog Gyu Kim; Sung Hee Cho; Yong Choul Lee; Jong Hwan Jeon, all of Cheonan, Rep. of Korea

[73] Assignee: Samsung Electronics Co., Ltd., Suwon, Rep. of Korea

[21] Appl. No.: 09/123,426

[22] Filed: Jul. 28, 1998

[30] Foreign Application Priority Data

Sep. 22, 1997 [KR] Rep. of Korea .................. 97-48081

[51] Int. Cl.[7] .................................................. B32B 31/00
[52] U.S. Cl. ........................................ 156/556; 156/569
[58] Field of Search ................................. 156/150, 556, 156/569

[56] References Cited

U.S. PATENT DOCUMENTS

| | | | |
|---|---|---|---|
| 3,698,621 | 10/1972 | Burke et al. ........................ | 228/4.5 |
| 3,928,749 | 12/1975 | Herrmann ........................... | 228/4.5 |
| 3,937,386 | 2/1976 | Hartleroad et al. ................ | 228/180 |
| 4,457,662 | 7/1984 | Ireland .............................. | 414/331 |
| 4,524,601 | 6/1985 | Bernardi ............................ | 72/422 |
| 4,550,871 | 11/1985 | Chan et al. ........................ | 228/4.5 |
| 4,627,151 | 12/1986 | Mulholland et al. .............. | 29/589 X |
| 4,765,531 | 8/1988 | Ricketson et al. ................. | 228/179 |
| 5,082,165 | 1/1992 | Ishizuka ............................. | 228/179 |
| 5,148,908 | 9/1992 | Ishizuka et al. ................... | 198/774.3 |
| 5,201,977 | 4/1993 | Aoshima ............................ | 156/153 |
| 5,372,972 | 12/1994 | Hayashi et al. .................... | 438/116 |
| 5,653,575 | 8/1997 | Park et al. ......................... | 414/797 |
| 5,897,290 | 4/1999 | Lu et al. ............................ | 414/790.4 |
| 5,899,341 | 5/1999 | Irita .................................... | 209/571 |

*Primary Examiner*—Francis J. Lorin
*Attorney, Agent, or Firm*—Jones Volentine, LLP

[57] ABSTRACT

A lead frame transfer device includes a platform, and front and rear fingers for moving the lead frame from a transfer position to a feeding position, via the platform, with minimal impact and while producing minimal mechanical abrasion. Each of the fingers includes a plate-like support for the lead frame, a vertical cylinder for moving the support in a vertical direction, and a horizontal cylinder for moving the support in a horizontal direction. The device also has a sensor for detecting the presence of a lead frame on the platform, and which detection is used to control the movement of the plate-like supports. A wire bonding apparatus employs two of such transfer devices on either side of a wire bonding head. Transfer rails extend past the transfer devices. One of the transfer devices serves as a loading mechanism which transfers a lead frame from the rails to the wire bonding head, while the other transfer device serves as an unloading mechanism which transfers the lead frame from the wire bonding head back onto the transfer rails. A plurality of the wire bonding apparatuses can be linked together to provide an in-line wire bonding apparatus. The wire bonding apparatuses receive the lead frames from a die bonding apparatus via a buffer which includes at least one magazine.

23 Claims, 5 Drawing Sheets

LEAD FRAME TRANSFER DEVICE AND WIRE BONDING APPARATUS COMPRISING THE SAME

BACKGROUND OF THE INVENTION

1. Field of the Invention

The present invention relates generally to an apparatus for manufacturing semiconductor integrated circuit devices. More particularly, the present invention relates to reducing impacts on a lead frame during its transfer, and to reducing the mechanical abrasion of IC devices and their transfer device.

2. Description of the Related Art

Usually, the assembling of a semiconductor integrated circuit device begins with die a bonding process in which an individual chip ('die') diced from a silicon wafer is attached to a lead frame.

A lead frame is a plate-like structure of leads for electrically connecting the chip to external electrical elements, and is made of copper alloys or iron-nickel alloys. It also supports the chip during the entire assembly process. The lead frame to which the chip is attached is electrically coupled to the chip through wires or is directly bonded via 'inner leads' thereof to metal pads of the chip. Then, the chip semi-assembly is encapsulated to protect the chip from exterior environmental stresses such as moisture, dust, or physical and electrical impacts. The package thus obtained is then subjected to a cutting/forming process in which the leads are cut and formed so as to be suitable for mounting to a circuit board. The package is then subjected to various electrical and reliability tests, and the packages which successfully pass the tests are supplied to the consumers.

During the semiconductor IC device assembly process, a strip consisting of a plurality of lead frames with identical lead patterns is transferred along a line so that a plurality of chips can be simultaneously die bonded and wire bonded. More specifically, the lead frame strip is moved to the bonding head of a wire bonding apparatus after the completion of the die bonding process. The lead frame should be transferred with extreme care so that the lead pattern or chip is not damaged, or so that the lead pattern or chip is not contaminated by any impurities generated by, for example, the abrasion of the transferring apparatus. Damage to the lead pattern or chip, or impurities may cause a failure in the wire bonding process, or decrease the yield of the assembly process. In particular, when transferring an LOC (Lead-On-Chip) type of lead frame strip in which the chip is attached to the bottom of the leads of the lead frame, the chip is susceptible to damage due to its direct contact with a transfer means such as a transfer belt.

The transfer of the lead frame strip is one of the important considerations in the in-line wire bonding systems in which a plurality of wire bonding apparatuses are linked together.

Accordingly, there is a need for a transfer apparatus which transfers the lead frames with great stability, which prevents the lead patterns and the chip from being damaged, and in which little mechanical abrasion of the transfer apparatus takes place.

SUMMARY OF THE INVENTION

Thus, an object of the present invention is to provide a transfer device in which minimal mechanical friction is generated between the lead frame or chip attached to the lead frame and the transfer device, and to provide a wire bonding apparatus comprising the same.

Another object of the present invention is to provide a transfer device having a relatively simple structure.

Still another object of the present invention is to provide a transfer device of a wire bonding apparatus which transfers the lead frame with stability to thereby prevent damage and maximize the yield of the wire bonding apparatus.

In order to achieve these objects, the present invention provides a transfer device for moving a lead frame from a transfer position to a feeding position, the transfer device comprising a platform, and front and rear fingers for moving the lead frame from the transfer position to the feeding position via the platform.

The front finger moves the lead frame from the transfer position to the platform and includes a plate-like lead frame support on which the lead frame rests, a vertical cylinder for moving the support in a vertical direction, and a horizontal cylinder for moving the support in a horizontal direction.

The rear finger moves the lead frame from the platform to the feeding position, and includes a second plate-like support which supports the lead frame, a vertical cylinder for moving the second plate-like support in a vertical direction, and a horizontal cylinder for moving the second plate-like support in a horizontal direction.

A sensor associated with the platform detects the presence of a lead frame on the platform. This detection is used to control the timing by which the lead frame is moved.

The objects of the present invention are also achieved by providing a wire bonding apparatus for electrically connecting a semiconductor chip to a lead frame, the wire bonding apparatus comprising transfer rails, a wire bonding head, and two of the above-described transfer devices disposed to either side of the wire bonding head.

The transfer rails, along which the lead frame carrying the chip is moved, extend past the transfer devices.

One of the transfer devices serves as a loading mechanism which moves the lead frame from the transfer rails to the wire bonding head.

The other of the transfer devices serves as an unloading mechanism which moves the lead frame, now having the chip wire-bonded thereto, from the wire bonding head back onto the transfer rails.

A plurality of the wire bonding apparatuses can be linked together to provide an in-line wire bonding apparatus. The wire bonding apparatuses receive the lead frames from a die bonding apparatus via a buffer which includes at least one magazine.

Because the transfer of the lead frames in the wire bonding apparatus(es) is carried out in a manner in which the lead frames are merely supported from below, i.e. are resting on the plate-like supports of the front and rear fingers or on the platform(s), the lead frames are subjected to minimal impact during their transfer, and their transfer is accompanied by minimal mechanical abrasion.

BRIEF DESCRIPTION OF THE DRAWINGS

These and various other objects, features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

The present invention will now be described in more detail with reference to the accompanying drawings.

Figure 1:
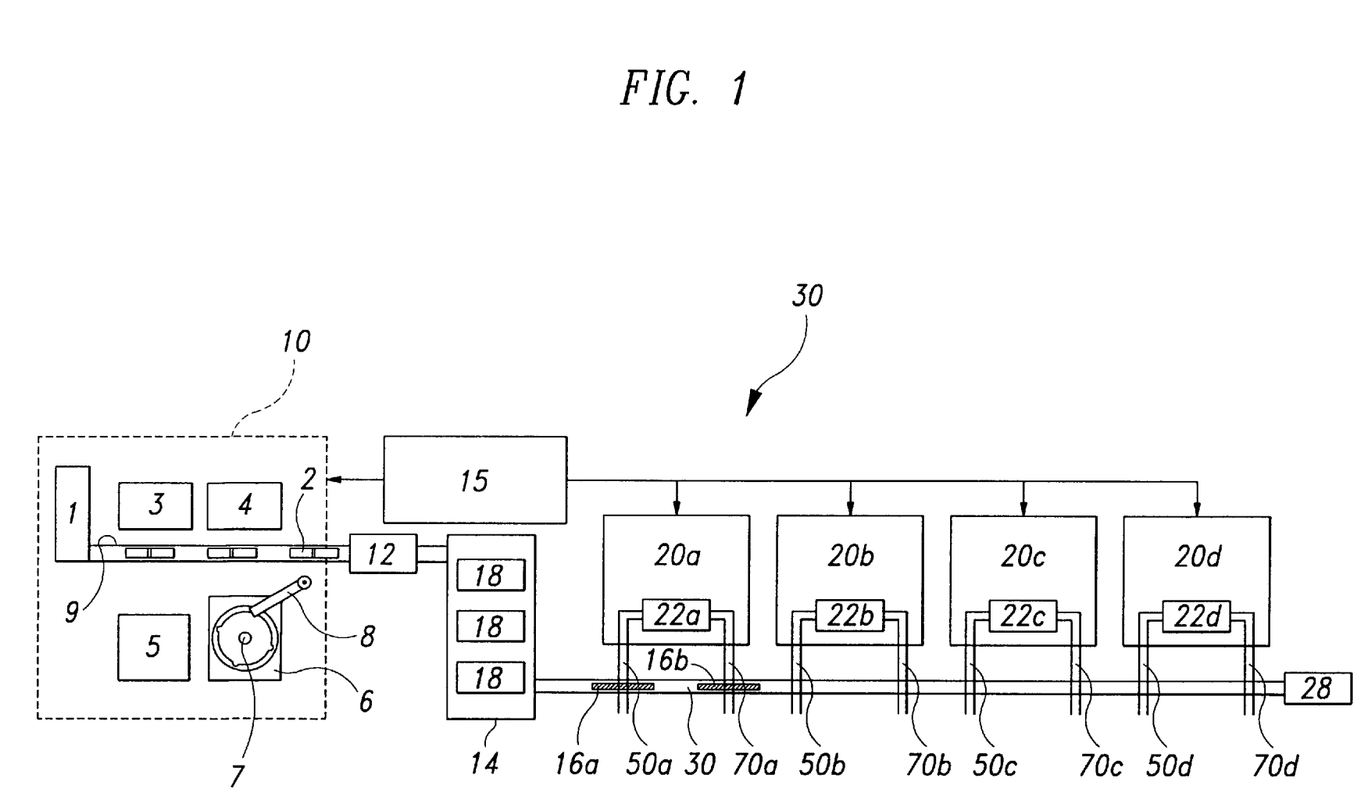
FIG. 1 is a schematic plan view of an in-line wire bonding system comprising linked wire bonding apparatuses according to the present invention.

FIG. 1 is a schematic plan view of an in-line wire bonding system to which the present invention can be applied. An in-line wire bonding system generally includes a plurality of wire bonding apparatuses and a plurality of die bonding apparatuses linked together to form a single work line capable of producing a high yield of semiconductor device products comprising chips electrically connected to lead frames. The in-line system does this by accommodating for differences in the output capacities of the individual processing stations. For example, the capacity of a die bonding station at which the chip is attached to die pads of the lead frame using an adhesive, such as an Ag-epoxy adhesive, is about four times greater than that of the wire bonding station. And, in the case of manufacturing LOC (Lead-On-Chip) packages, in which the die bonding process is carried out with a polyimide tape requiring the application of heat and pressure for about 0.8–2 seconds, the capacity of the die bonding station is about twice that of the wire bonding station. In consideration of these differences in output capacities, an in-line system comprising only one die bonding apparatus and a plurality of wire bonding apparatuses has been recently employed. This type of in-line system is particularly advantageous for the mass assembly and production of memory devices. Such an in-line wire bonding apparatus is disclosed, for example, in commonly assigned pending U.S. patent application Ser. No. 08/608,249 ('249 application), which is incorporated herein by reference in its entirety for all purposes.

Now, again referring to FIG. 1, the in-line wire bonding system 40 comprises a die bonding apparatus 10, four wire bonding apparatuses (20a, 20b, 20c, 20d) and a transfer rail system for transporting lead frames (16a, 16b, etc.).

In this system, lead frames in a cassette 1 are fed one-by-one onto a working rail 9 by a lead frame separator (not shown). The lead frames 2 on the rail 9 have lead patterns to be electrically connected to the electrical pads of a chip. These lead patterns are connected to each other by a side rail to form a lead frame strip. A wafer cassette 5 contains wafers having integrated circuit elements and which have had their backs ground, have been scribed (or diced) and have had a tape attached to their backs. Such a wafer (not shown) is mounted on an X-Y table 6. There, a chip separator 7 separates individual chips from the wafer, and the individual chips are then transported to a die bonding head 4 by a chip transport module 8. The die pads (not shown) of the lead frame 2 located on the rail 9 adjacent the bonding head 4 are supplied with dots of adhesive, such as an Ag-epoxy adhesive. In the case where the chip is directly attached to the leads of the lead frame, which is pad-free, for example, in the case of LOC packages, the adhesive is not required.

The bonding head 4 aligns the lead frame and the chip, and presses them together while they are heated to bond them together.

The lead frame to which the chip is attached by the die bonding apparatus 10 is then moved into an oven 12 where the adhesive will be cured at a predetermined temperature, e.g., 180 to 200 degrees Celsius, for a predetermined period of time, e.g., 1 to 2 minutes. A buffer 14 comprises a plurality of magazines 18 to which the lead frames are transported after the die bonding process is completed. The lead frames are stacked in the magazines 18 before they are transported to the wire bonding apparatuses. A plurality of magazines are used to feed the lead frames to the wire bonding apparatuses so that even if the die bonding apparatus 10 goes down, lead frames can still be continuously fed to the wire bonding apparatuses. Moreover, when the die bonding apparatus 10 can not output a sufficient quantity of die-bonded lead frames, lead frames which are die-bonded by a die bonding apparatus from another line can be fed into the buffer 14 so that the process can continue uninterrupted. A lead frame 16a having a chip attached thereto is transported to lead frame transfer rails 30 from the inlet magazines 18, whereupon the lead frame 16a undergoes a wire bonding process in one of the four wire bonding apparatuses (20a, 20b, 20c, 20d).

The bonding apparatuses (20a, 20b, 20c, 20d) each comprise a loading section (50a, 50b, 50c, 50d), an unloading section (70a, 70b, 70c, 70d), and a wire bonding head (22a, 22b, 22c, 22d). Wire-bonded lead frames are transported by the transfer rails 30 to outlet magazines 28, from which the lead frames will be transferred to downstream assembly stations, such as a molding station. The outlet magazines 28 have the same structure as the inlet magazines 18 of the buffer 14.

A controller 15 comprises a microprocessor which controls the transport of the lead frames and the overall operation of the system. The microprocessor can be programmed to operate the system based on the size and shape of the lead frame as well as on the structure of the chip.

The loading section of the wire bonding apparatus transports the lead frame 16a moving along the rails 30 to the bonding head, while the unloading section removes the lead frame 16b from the wire bonding head and transports it to the rails 30.

Figure 2:
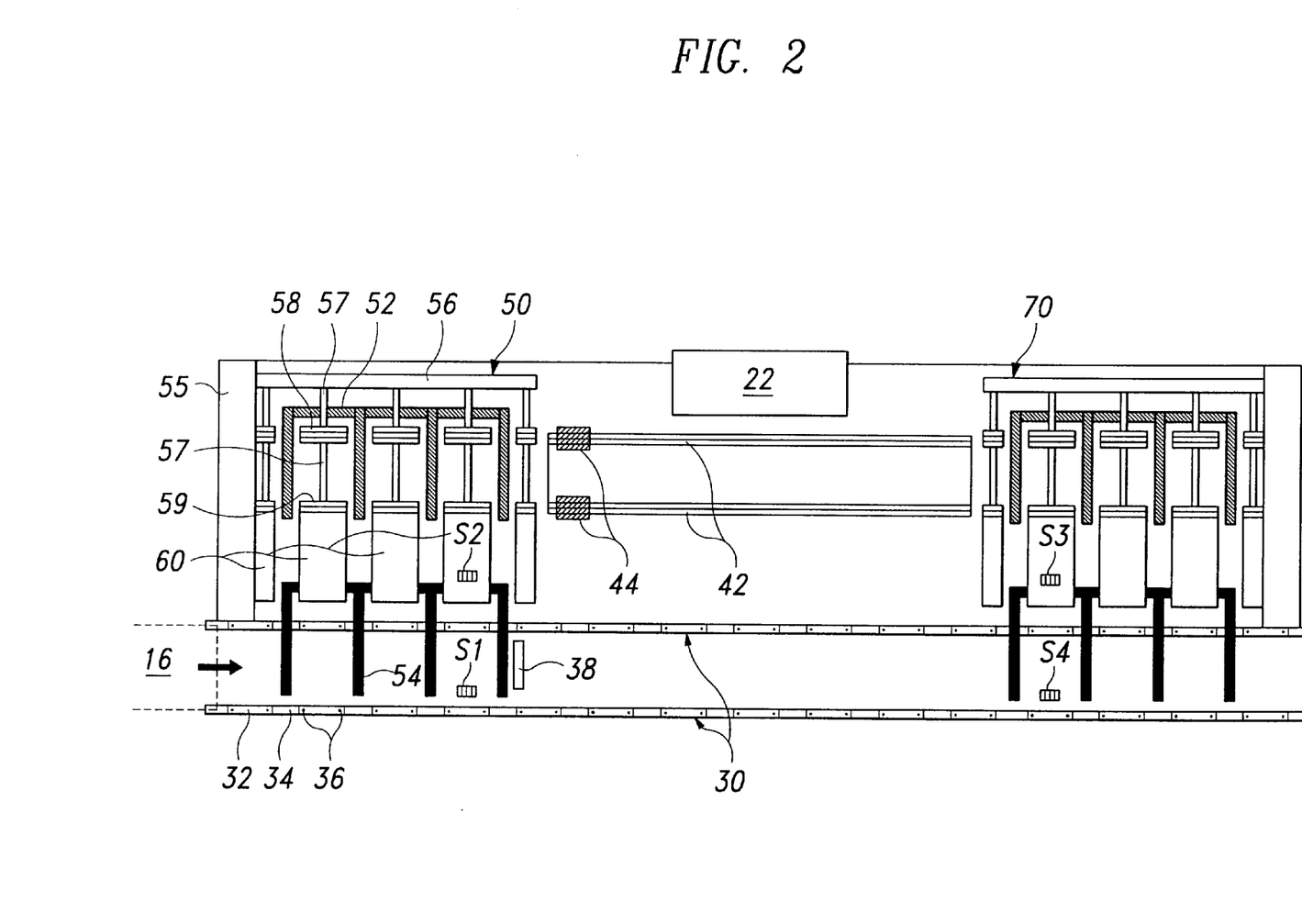
FIG. 2 is a schematic plan view of a wire bonding apparatus comprising a lead frame transfer device according to the present invention.

FIG. 2 is a schematic plan view of such a wire bonding apparatus comprising lead frame transfer devices according to the present invention. The loading section 50 and the unloading section 70 have the same structure. Therefore, only the loading section 50 will be described in detail below.

The lead frame loading section 50 includes a lead frame transfer device comprising two fingers, namely, a rear finger 52 and a front finger 54, a platform 60 and a sensor S2. The front finger 54 transports the lead frame 16 moving along the transfer rails 30 to the platform 60. The rails may be air-vent rails as disclosed in the commonly assigned '249 application. The air vent rails comprise a plurality of rail blocks 32 formed with air holes (vents) from which air, for example, issues to move the lead frame 16. The rail blocks 32 are spaced from each other to form spaces 34 therebetween, and in which spaces 34 the front finger moves vertically.

A sensor S1 detects for the presence of the lead frame 16 moving along the rails 30. If no lead frame is present at the wire bonding head 22 and the sensor S1 detects a lead frame, a stopper 38 stops the lead frame and the front finger 54 picks up the lead frame from the rails 30. The front finger 54 carrying the lead frame 16 moves from the position shown in FIG. 2 to an intermediate transfer position, i.e. to the platform 60, and places the lead frame 16 on the platform 60. The sensor S2 provided at the platform 60 detects for the presence of the lead frame on the platform 60. The information acquired by the sensors S1, S2 is transmitted to the controller 15 (FIG. 1) and is used by the controller 15 to control the operations of the stopper 38, the front finger 54, the rear finger 52, and a feeding clamp 44. Sensors S3 and S4 of the lead frame unloading section 70 also detect for the presence of the lead frame, and the information acquired by the sensors S3, S4 is also used by the controller 15 to control the operation of the apparatus.

The lead frame on the platform 60 is moved to guide rails 58, 59 by the rear finger 52. The front guide rail 58 and the rear guide rail 59, together with the lead frame feeding rails 42, support the lead frame as it is moved to the bonding head 22. The guide rails 58, 59 are supported by a column 55, a relay plate 56 and shafts 57. The lead frame on the guide rails 58, 59 is moved to the lead frame feeding rails 42 by the feeding clamp 44 and is then moved to the bonding head 22 along the feeding rails 42.

Two or more of the wire bonding apparatuses are integrated, i.e., linked together, in the in-line wire bonding system, as shown in FIG. 1.

According to the present invention, the friction between the lead frame and the transfer devices is minimal because the lead frame rests on the front finger 54 during its transport from the transfer rails 30 to the platform 60, and rests on the rear finger 52 during its transport from the platform 60 to the guide rails 58, 59, as will be described hereinafter.

Figure 3:
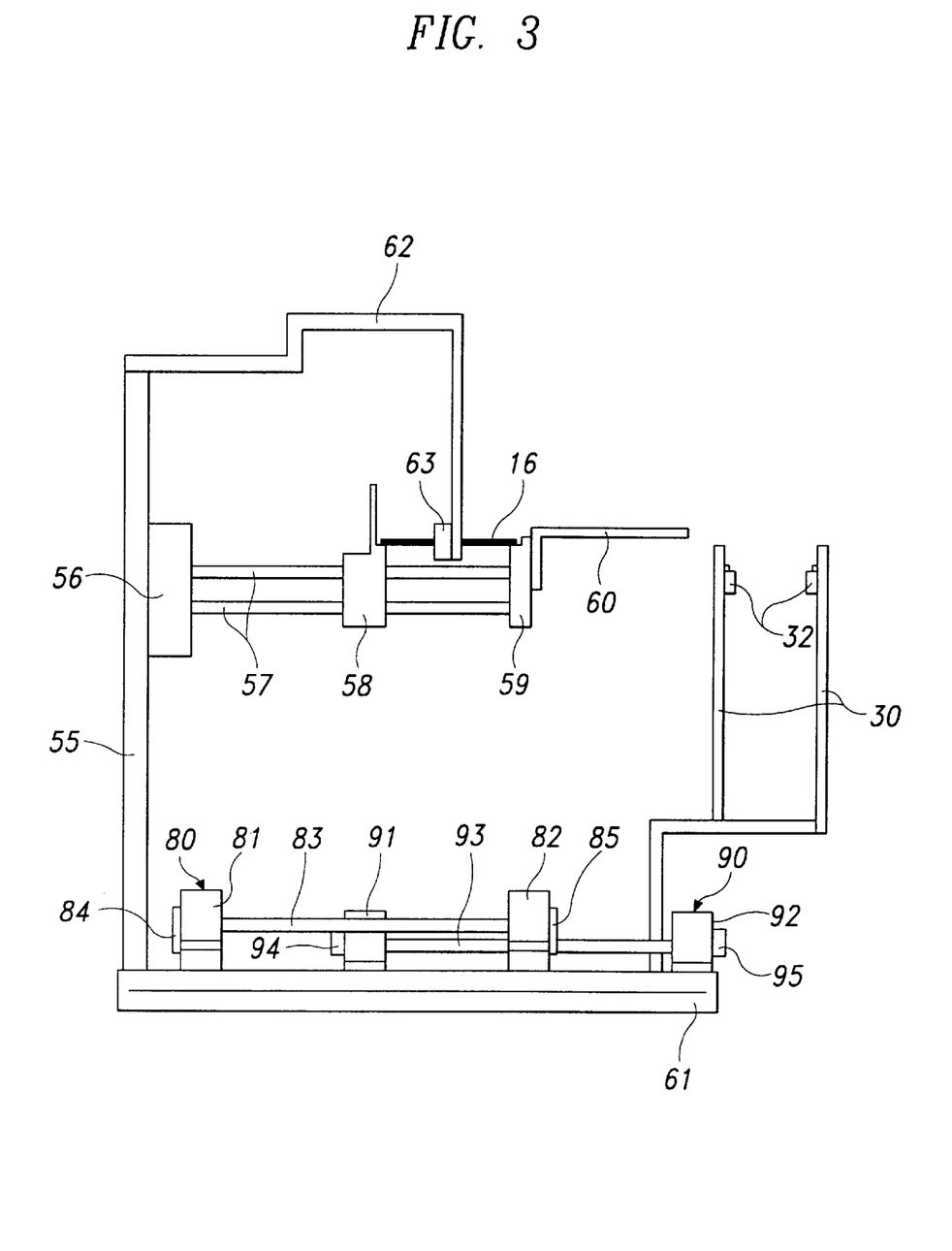
FIG. 3 is a side view of the lead frame transfer device according to the present invention.

FIG. 3 is a side view of the lead frame transfer device according to the present invention, in which the front and rear fingers are not shown for the sake of simplicity. The rear finger is coupled to a rear cylinder assembly 80, and the front finger is coupled to a front cylinder assembly 90. The cylinder assemblies 80, 90 are fastened to a base plate 61 and provide the horizontal linear movement of the front and rear fingers.

The rear cylinder assembly 80 includes cylinder fastening blocks 81, 82, a horizontal shaft 83 and a stopper 84. The horizontal shaft 83 is coupled to the rear finger, and the rear finger 83 is reciprocated along the horizontal shaft 83. The distance over which the rear finger can move is set by the stopper 84.

The front cylinder assembly 90 also includes cylinder fastening blocks 91, 92, a horizontal shaft 93 and a stopper 94. The front finger is coupled to the horizontal shaft 93 and transports the lead frame from the transfer blocks 32 of the transfer rails 30.

The base plate 61 has a column 55 fixed thereto. The relay plate 56 is coupled to the column 55 and the shafts 57. The shafts 57 in turn support the guide rails 58, 59. The platform 60 is coupled to the front guide rail 59. A pusher plate 62 coupled to one end of the column 55 has a pusher 63. The pusher 63 pushes the lead frame 16 to the lead frame feeding rail 42, after the lead frame 16 is transported from the platform 60 onto the guide rails 58, 59 by the rear finger.

Figure 4:
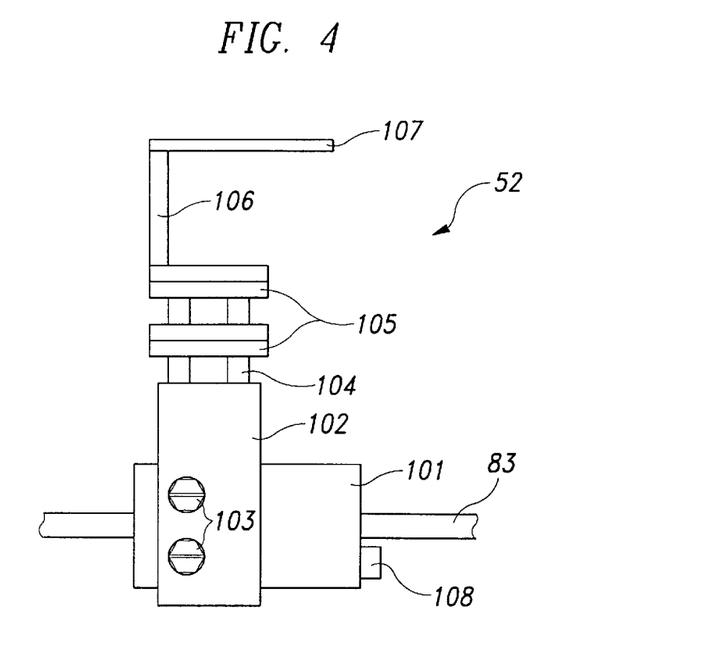
FIG. 4 is a side view of a rear finger of the lead frame transfer device according to the present invention.

FIG. 4 is a side view of the rear finger of the lead frame transfer device according to the present invention. The rear finger 52 comprises a horizontal cylinder 101, a vertical cylinder 102 and a plate-like lead frame support 107 (hereinafter referred to as merely "lead frame plate 107" or "plate 107"). The horizontal cylinder 101 is coupled to the horizontal shaft 83 of the rear cylinder assembly 80 so as to be reciprocatable along the shaft 83. A buffering means 108 is coupled to the horizontal cylinder 101 to reduce the impact when the rear finger 52 is stopped by, for example, the stopper 85. The vertical cylinder 102 is coupled to the horizontal cylinder 101 by way of fastening means 103. The vertical cylinder 102 moves vertical shafts 104 in the vertical direction, causing the rear plates 105, a linking bar 106 and the lead frame plate 107 (all of which are coupled to the vertical shafts 104) to move vertically.

Figure 5:
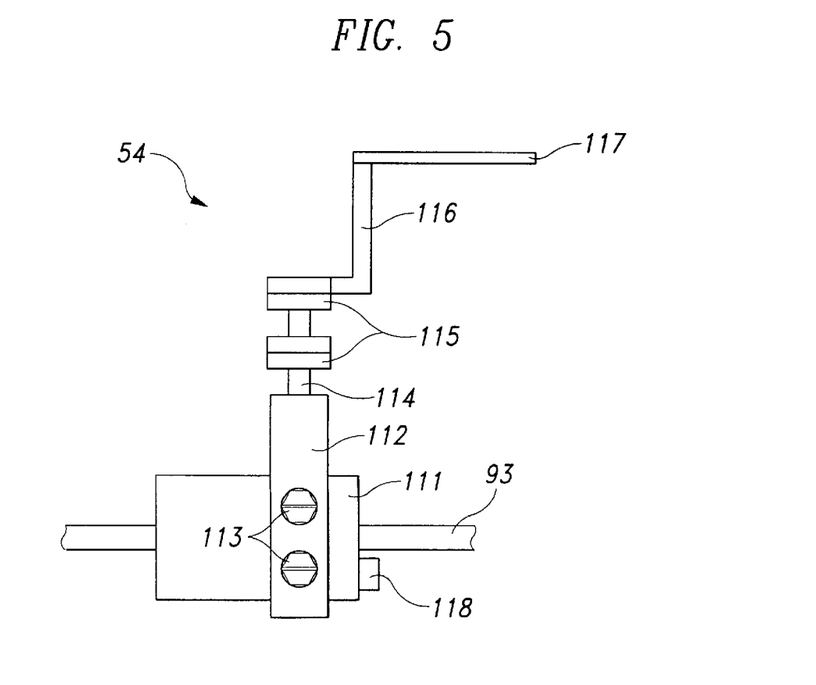
FIG. 5 is a side view of a front finger of the lead frame transfer device according to the present invention.

FIG. 5 is a side view of the front finger of the lead frame transfer device according to the present invention. Like the rear finger 52, the front finger 54 comprises a horizontal cylinder 111, a vertical cylinder 112 and a plate-like lead frame support 117 (referred to hereinafter as merely "lead frame plate 117" or "plate 117"). The horizontal cylinder 111 is coupled to the horizontal shaft 83 of the front cylinder assembly 90 so as to be reciprocatable along the shaft 93. A buffering means 118 is coupled to the horizontal cylinder 111 to reduce the impact when the front finger 54 is stopped by, for example, the stopper 95. The vertical cylinder 112 is coupled to the horizontal cylinder 111 by way of fastening means 113. The vertical cylinder 112 moves vertical shafts 114 in the vertical direction, causing the front plates 115, a linking bar 106 and the lead frame plate 117 (all of which are coupled to the vertical shaft 114) to move vertically.

Components of the rear finger 52 and the front finger 54 have similar functions, but are different in other respects. For example, the dimensions and the coupling of the front and rear plates 105, 115, the linking bars 106, 116, and the plates 107, 117 of the front and rear fingers are different, as can be appreciated from FIG. 4 and FIG. 5. Nonetheless, the front and rear fingers could have the same structure.

The vertical cylinders 101, 111 and the horizontal cylinders 102, 112 used for the front finger 54 and the rear finger 52 may be pneumatic cylinders. Pneumatic cylinders are advantageous over motor-driven conveyor belt systems in that the former has a simpler structure and produces less mechanical abrasion and noise.

Figure 6:
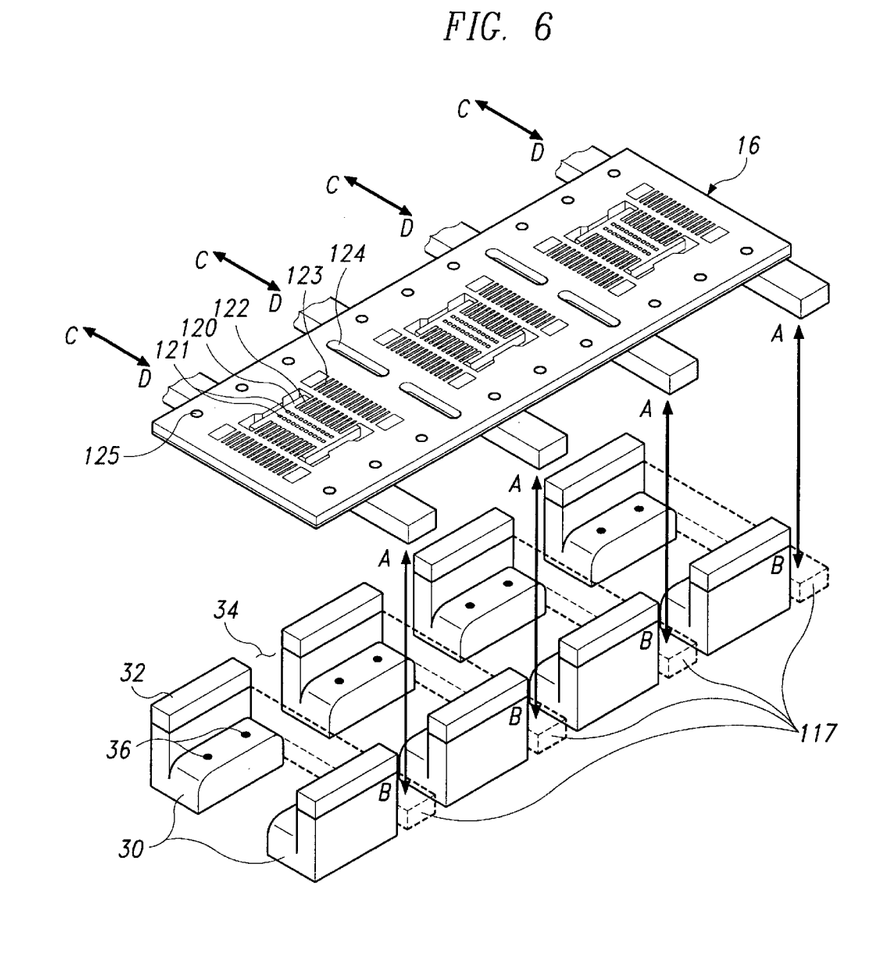
FIG. 6 is a perspective view of part of the wire bonding apparatus, and depicts the transfer of the lead frame from a transfer rail by the front finger of the transfer device according to the present invention.

FIG. 6 is a perspective view of the portion of the wire bonding apparatus which transfers the lead frame from the transfer rails 30. Four tines of the plate 117 of the front finger 54 are placed in the spaces 34 between the individual rail blocks 32 of the transfer rails 30. The lead frame 16, which is moving along the transfer rails 30 under the force of air supplied form the air vent holes 36 in the rail blocks 32, is stopped by the stopper 38 (FIG. 2) and is transferred upward by the plate 117. The plate 117 is moved in the vertical direction, indicated by the arrow A-B, by the vertical cylinder 112.

The plate 117, on which the lead frame 16 now rests, transports the lead frame 16 to the platform 60. In this respect, the plate 117 is moved in the direction indicated by the arrow C-D by the horizontal cylinder 111. The lead frame 16 may be an LOC product in which chips 120 are attached to the bottom surface of the inner leads 122. The inner leads 122 of the lead frame are electrically connected to the pads 121 of the chip 120 via bonding wires. Outer leads 123 are integrated with corresponding ones of the inner leads 122, and slots 124 partition the lead frame strip into individual lead frames. Sprocket holes 125 allow a clamp 44 to transfer (index) the lead frame from the guide rails 58, 59 to the feeding rails 42.

As can be seen from FIG. 2, when the plate 117 of the front finger 54 transfers the lead frame onto the platform 60, the tines of the plate 117 are inserted by cylinder 112 between spaced apart plates which make up the platform 60. Likewise, when the plate 107 of the rear finger 52 transfers the lead frame from the platform, the tines thereof are moved upward by cylinder 102 into the spaces between the plates of the platform 60.

As described hereinabove, in the present invention, minimal friction is generated between transfer devices, e.g., between the plates 107, 117 and the lead frame. Furthermore, the abrading of the chip by the transfer devices is minimal. Therefore, the present invention is particularly suitable for transporting LOC lead frames.

Moreover, the present invention may be advantageously employed by an in-line wire bonding apparatus in which a plurality of wire bonding apparatuses are linked together.

Although preferred embodiments of the present invention have been described in detail hereinabove, many variations and/or modifications of the basic inventive concepts herein taught will appear to those skilled in the art. All such variations and modifications are seen to be within the true spirit and scope of the present invention as defined by the appended claims.

What is claimed is:

1. A transfer device for transferring a lead frame between a transfer position and a feeding position, said transfer device comprising:
   (a) a front finger including a first plate-like lead frame support, and a first pair of cylinders operatively connected to said first lead frame support so as to move said first support between an initial transfer position and an intermediate transfer position, said first pair of cylinders comprising a vertical cylinder operatively connected to said first lead frame support so as to move said first support vertically, and a horizontal cylinder operatively connected to said first lead frame support so as to move said first support horizontally;
   (b) a platform at which the intermediate transfer position is defined, and a sensor operatively associated with said platform so as to sense the presence of a lead frame moved onto the platform by said front finger when the lead frame support of said front finger is moved from said initial transfer position to said intermediate transfer position; and
   (c) a rear finger including a second plate-like lead frame support, and a second pair of cylinders operatively connected to said second lead frame support so as to move said second support between the intermediate transfer position and a feeding position, said second pair of cylinders comprising a vertical cylinder operatively connected to said second lead frame support so as to move said second support vertically, and a horizontal cylinder operatively connected to said second lead frame support so as to move said second support horizontally.

2. A transfer device according to claim 1, wherein the vertical and horizontal cylinders of said front and rear fingers are pneumatic cylinders.

3. A transfer device according to claim 1, wherein said front and rear fingers further include stoppers disposed in the paths of the horizontal cylinders thereof, respectively, the distances over which the horizontal cylinders can move the plate-like lead frame supports being set by the stoppers, respectively.

4. A transfer device according to claim 1, wherein each of said front and rear fingers includes a respective vertical shaft, and a linking bar operatively connecting the vertical cylinder thereof to the plate-like lead frame support thereof.

5. A transfer device according to claim 1, wherein each of said plate-like lead frame supports has a plurality of tines, and said platform comprises a plurality of spaced-apart plates, the tines of the first plate-like lead frame support of said front finger being disposed between the plates of said platform when the front finger is at said intermediate transfer position, and the tines of the second plate-like lead frame support of said rear finger also being disposed between the plates of said platform when the rear finger is at said intermediate transfer position.

6. A wire bonding apparatus for electrically connecting a semiconductor chip to a lead frame, said wire bonding apparatus comprising:
   transfer rails configured to transport a lead frame carrying a chip;
   a lead frame loading mechanism comprising: (a) a front finger including a first plate-like lead frame support, and a first pair of cylinders operatively connected to said first lead frame support so as to move said first support between said transfer rails and a first intermediate transfer position, said first pair of cylinders comprising a vertical cylinder operatively connected to said first lead frame support so as to move said first support vertically, and a horizontal cylinder operatively connected to said first lead frame support so as to move said first support horizontally, (b) a first platform at which the first intermediate transfer position is defined, and a first sensor operatively associated with said first platform so as to sense the presence of a lead frame moved onto the first platform by said front finger when the lead frame support of said front finger is moved from said rails to said first intermediate transfer position, and (c) a rear finger including a second plate-like lead frame support, and a second pair of cylinders operatively connected to said second lead frame support so as to move said second support between the first intermediate transfer position and a first feeding position, said second pair of cylinders comprising a vertical cylinder operatively connected to said second lead frame support so as to move said second support vertically, and a horizontal cylinder operatively connected to said second lead frame support so as to move said second support horizontally;
   a wire bonding head disposed downstream of the first feeding position in the apparatus so as to receive a lead frame carrying a chip from the said loading mechanism; and
   a lead frame unloading mechanism disposed downstream of said wire bonding head so as to receive a lead frame wire bonded to a chip from said wire bonding head, said lead frame unloading mechanism comprising: (d) a rear finger including a third plate-like lead frame support, and a third pair of cylinders operatively connected to said third lead frame support so as to move said third support between a secondary transfer position and a second intermediate transfer position, said third pair of cylinders comprising a vertical cylinder operatively connected to said third lead frame support so as to move said third support vertically, and a horizontal cylinder operatively connected to said third lead frame support so as to move said third support horizontally, (e) a second platform at which the second intermediate transfer position is defined, and a second sensor operatively associated with said second platform so as to sense the presence of a lead frame moved onto the second platform by said rear finger when said third lead frame support is moved from said secondary transfer position to said second intermediate transfer position, and (f) a front finger including a fourth plate-like lead frame support, and a fourth pair of cylinders operatively connected to said fourth lead frame support so as to move said fourth support between the second intermediate transfer position and said transfer rails, said fourth pair of cylinders comprising a vertical cylinder operatively connected to said fourth lead frame support so as to move said fourth support vertically, and a horizontal cylinder operatively connected to said fourth lead frame support so as to move said fourth support horizontally.

7. A wire bonding apparatus according to claim 6, wherein the vertical and horizontal cylinders of said front and rear fingers of both said loading and unloading mechanisms are pneumatic cylinders.

8. A wire bonding apparatus according to claim 6, and further comprising sensors disposed at said transfer rails proximate said loading and unloading mechanisms, respectively, and operative to detect the presence of lead frames adjacent said loading and unloading mechanisms.

9. A wire bonding apparatus according to claim 6, and further comprising lead frame feeding rails traversing said bonding head, and wherein said lead frame loading mechanism and said lead frame unloading mechanism each further comprise guide rails linearly coupled to said lead frame feeding rails, respectively.

10. A wire bonding apparatus according to claim 9, wherein the platform of each of said loading and unloading mechanisms is fastened to one of the guide rails thereof.

11. A wire bonding apparatus according to claim 10, wherein said lead frame loading mechanism further comprises a pusher operative to push a lead frame carrying a chip from the guide rails of the loading mechanism to said lead frame feeding rails.

12. A transfer device according to claim 6, wherein each of said plate-like lead frame supports has a plurality of tines, and each of said platforms comprises a plurality of spaced-apart plates, the tines of the first plate-like lead frame support being disposed between the plates of said first platform when the front finger of said loading mechanism is at said first intermediate transfer position, the tines of the second plate-like lead frame support also being disposed between the plates of said first platform when the rear finger of said loading mechanism is at said first intermediate transfer position, the tines of the third plate-like lead frame support being disposed between the plates of said second platform when the rear finger of said unloading mechanism is at said second intermediate transfer position, and the tines of the fourth plate-like lead frame support also being disposed between the plates of said second platform when the rear finger of said unloading mechanism is at said second intermediate transfer position.

13. An in-line wire bonding apparatus comprising:
a plurality of wire bonding apparatuses;
transfer rails extending alongside said wire bonding apparatuses and configured to transport lead frames carrying chips;
each of said wire bonding apparatuses comprising:
a lead frame loading mechanism comprising: (a) a front finger including a first plate-like lead frame support, and a first pair of cylinders operatively connected to said first lead frame support so as to move said first support between said transfer rails and a first intermediate transfer position, said first pair of cylinders comprising a vertical cylinder operatively connected to said first lead frame support so as to move said first support vertically, and a horizontal cylinder operatively connected to said first lead frame support so as to move said first support horizontally, (b) a first platform at which the first intermediate transfer position is defined, and a first sensor operatively associated with said first platform so as to sense the presence of a lead frame moved onto the first platform by said front finger when the lead frame support of said front finger is moved from said rails to said first intermediate transfer position, and (c) a rear finger including a second plate-like lead frame support, and a second pair of cylinders operatively connected to said second lead frame support so as to move said second support between the first intermediate transfer position and a first feeding position, said second pair of cylinders comprising a vertical cylinder operatively connected to said second lead frame support so as to move said second support vertically, and a horizontal cylinder operatively connected to said second lead frame support so as to move said second support horizontally;

a wire bonding head disposed downstream of the first feeding position in the apparatus so as to receive a lead frame carrying a chip from the said loading mechanism; and a lead frame unloading mechanism disposed downstream of said wire bonding head so as to receive a lead frame wire bonded to a chip from said wire bonding head, said lead frame unloading mechanism comprising: (d) a rear finger including a third plate-like lead frame support, and a third pair of cylinders operatively connected to said third lead frame support so as to move said third support between a secondary transfer position and a second intermediate transfer position, said third pair of cylinders comprising a vertical cylinder operatively connected to said third lead frame support so as to move said third support vertically, and a horizontal cylinder operatively connected to said third lead frame support so as to move said third support horizontally, (e) a second platform at which the second intermediate transfer position is defined, and a second sensor operatively associated with said second platform so as to sense the presence of a lead frame moved onto the second platform by said rear finger when said third lead frame support is moved from said secondary transfer position to said second intermediate transfer position, and (f) a front finger including a fourth plate-like lead frame support, and a fourth pair of cylinders operatively connected to said fourth lead frame support so as to move said fourth support between the second intermediate transfer position and said transfer rails, said fourth pair of cylinders comprising a vertical cylinder operatively connected to said fourth lead frame support so as to move said fourth support vertically, and a horizontal cylinder operatively connected to said fourth lead frame support so as to move said fourth support horizontally; and a controller operatively connected to said sensors and to each of the loading and unloading mechanisms of said wire bonding apparatuses so as to control the movement of said front and said rear fingers of the loading and unloading mechanisms based on the detections made by said sensors.

14. An in-line wire bonding apparatus according to claim 13, wherein said transfer rails comprise a plurality of transfer blocks having air vent holes so that the lead frames can be moved by air supplied through said air vent holes.

15. An in-line wire bonding apparatus according to claim 13, wherein the vertical and horizontal cylinders of said front and rear fingers of both said loading and unloading mechanisms of each of said wire bonding apparatuses are pneumatic cylinders.

16. An in-line wire bonding apparatus according to claim 13, wherein each of said wire bonding apparatuses further comprises lead frame feeding rails traversing the bonding head thereof, and said lead frame loading mechanism and said lead frame unloading mechanism of each of said wire bonding apparatuses each further comprising guide rails linearly coupled to the lead frame feeding rails thereof, respectively.

17. An in-line wire bonding apparatus according to claim 16, wherein each of the platforms of each wire bonding apparatus is fastened to one of said guide rails thereof.

18. An in-line wire bonding apparatus according to claim 17, wherein said lead frame loading mechanism of each wire bonding apparatus further comprises a pusher operative to push a lead frame carrying a chip from the guide rails of the loading mechanism thereof to said lead frame feeding rails thereof.

19. An in-line wire bonding apparatus according to claim 13, and further comprising a group of sensors disposed at said transfer rails proximate said loading and unloading mechanisms, respectively, of each of said wire bonding apparatuses, and operative to detect the presence of lead frames adjacent said loading and unloading mechanisms, said controller being operatively connected to said group of sensors so as to control said loading and unloading mechanisms of said wire bonding apparatuses based on detections made by said group of sensors.

20. An in-line wire bonding apparatus according to claim 13, wherein, with respect to each of said wire bonding apparatuses: each of said plate-like lead frame supports has a plurality of tines, and each of said platforms comprises a plurality of spaced-apart plates, the tines of the first plate-like lead frame support being disposed between the plates of said first platform when the front finger of said loading mechanism is at said first intermediate transfer position, the tines of the second plate-like lead frame support also being disposed between the plates of said first platform when the rear finger of said loading mechanism is at said first intermediate transfer position, the tines of the third plate-like lead frame support being disposed between the plates of said second platform when the rear finger of said unloading mechanism is at said second intermediate transfer position, and the tines of the fourth plate-like lead frame support also being disposed between the plates of said second platform when the front finger of said unloading mechanism is at said second intermediate transfer position.

21. An in-line wire bonding apparatus according to claim 14, wherein said transfer blocks are spaced apart from one another; and wherein, with respect to each of said wire bonding apparatuses: each of said plate-like lead frame supports has a plurality of tines, and each of said platforms comprises a plurality of spaced-apart plates, the tines of the first plate-like lead frame support being disposed between the transfer blocks of said transfer rails when the front finger of said loading mechanism is at said initial transfer position, the tines of the first plate-like lead frame support being disposed between the plates of said first platform when the front finger of said loading mechanism is at said first intermediate transfer position, the tines of the second plate-like lead frame support also being disposed between the plates of said first platform when the rear finger of said loading mechanism is at said first intermediate transfer position, the tines of the third plate-like lead frame support being disposed between the plates of said second platform when the rear finger of said unloading mechanism is at said second intermediate transfer position, the tines of the fourth plate-like lead frame support also being disposed between the plates of said second platform when the front finger of said unloading mechanism is at said second intermediate transfer position, and the tines of the fourth plate-like lead frame support being disposed between the transfer blocks of said transfer rails when the front finger of said unloading mechanism is at said feeding position.

22. An in-line wire bonding apparatus according to claim 13, and further comprising a magazine, configured to store a stack of the lead frames, connected to said transfer rails upstream of the wire bonding apparatuses.

23. An in-line wire bonding apparatus according to claim 22, and further comprising a die bonding apparatus which attaches the chips to the lead frames, said magazine being disposed downstream of said die bonding apparatus.

* * * * *